United States Patent
Tian et al.

(10) Patent No.: US 8,343,308 B2
(45) Date of Patent: Jan. 1, 2013

(54) CEILING PLATE AND PLASMA PROCESS APPARATUS

(75) Inventors: Caizhong Tian, Amagasaki (JP);
Tetsuya Nishizuka, Amagasaki (JP);
Kiyotaka Ishibashi, Amagasaki (JP);
Toshihisa Nozawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 476 days.

(21) Appl. No.: 12/441,429

(22) PCT Filed: Aug. 20, 2008

(86) PCT No.: PCT/JP2008/064854
§ 371 (c)(1),
(2), (4) Date: Aug. 17, 2009

(87) PCT Pub. No.: WO2009/028376
PCT Pub. Date: Mar. 5, 2009

(65) Prior Publication Data
US 2010/0032094 A1 Feb. 11, 2010

(30) Foreign Application Priority Data
Aug. 28, 2007 (JP) ................................ 2007-221524

(51) Int. Cl.
*C23C 16/00* (2006.01)
*C23F 1/00* (2006.01)
*H01L 21/306* (2006.01)

(52) U.S. Cl. ......... 156/345.41; 156/345.36; 156/345.42; 156/345.35; 118/723 MW; 118/723 R; 118/723 ME; 118/723 MR; 118/723 MA

(58) Field of Classification Search ............. 156/345.41, 156/345.35, 345.36, 345.42; 118/723 MW, 118/723 R, 723 ME, 723 MR, 723 MA
See application file for complete search history.

(56) References Cited

U.S. PATENT DOCUMENTS

| | | | |
|---|---|---|---|
| 5,611,864 A * | 3/1997 | Kimura et al. | 118/723 MR |
| 2004/0149741 A1* | 8/2004 | Ishii et al. | 219/678 |
| 2005/0172901 A1* | 8/2005 | Ishibashi et al. | 118/723 I |
| 2007/0113788 A1* | 5/2007 | Nozawa et al. | 118/723 MW |

FOREIGN PATENT DOCUMENTS

| | | |
|---|---|---|
| JP | 03-191073 | 8/1991 |
| JP | 05-343334 | 12/1993 |
| JP | 09-181052 | 7/1997 |
| JP | 09-232099 | 9/1997 |
| JP | 2000-273646 | 10/2000 |
| JP | 2003-059919 | 2/2003 |

(Continued)

OTHER PUBLICATIONS

English Translation JP 09-232099, Tauchi et al dated Sep. 5, 1997.*
English Translation JP 2000-273646, Mitsuhira et al dated Oct. 3, 2000.*

(Continued)

*Primary Examiner* — Rakesh Dhingra
(74) *Attorney, Agent, or Firm* — IPUSA, PLLC

(57) ABSTRACT

A ceiling plate provided at a ceiling portion of a process chamber that may be evacuated to a vacuum is disclosed. The ceiling plate allows microwaves emitted from a slot of a planar antenna member provided along with the ceiling plate to pass through the ceiling plate into the process chamber, and includes plural concave portions provided along a circle on a surface of the ceiling plate, the surface facing toward an inside of the process chamber.

6 Claims, 10 Drawing Sheets

FOREIGN PATENT DOCUMENTS

| | | |
|---|---|---|
| JP | 2003-168681 | 6/2003 |
| JP | 2004-014262 | 1/2004 |
| JP | 2004-200307 | 7/2004 |
| JP | 2005-100931 | 4/2005 |

OTHER PUBLICATIONS

Japanese Office Action mailed May 25, 2010 with partial translation.
Chinese Office Action mailed Sep. 19, 2010 with partial translation.

* cited by examiner

CEILING PLATE AND PLASMA PROCESS APPARATUS

TECHNICAL FIELD

The present invention relates to a plasma process apparatus used when a semiconductor wafer and the like are processed by applying plasma generated by microwaves onto the semiconductor wafer and the like, and a ceiling plate for use in the plasma process apparatus.

BACKGROUND ART

In recent years, plasma process apparatuses have been employed for film deposition, etching, ashing and the like in semiconductor product fabrication processes along with further miniaturization and higher integration of semiconductor products. Especially, a microwave plasma apparatus that generates plasma using microwaves tends to be more frequently used, because high density plasma can be stably generated even in a high vacuum environment, e.g., at relatively low pressures from 0.1 through 10 Pa.

Such a plasma process apparatus is disclosed in Patent Documents 1 through 6. A general plasma process apparatus is schematically explained in reference to FIG. 1, which schematically shows the general plasma process apparatus.

In FIG. 1, a plasma process apparatus 2 is provided with a susceptor 6 on which a semiconductor wafer is placed in a process chamber 4 that can be evacuated to a vacuum. At a ceiling portion opposing the susceptor 6, a disk-shaped ceiling plate 8 is hermetically provided that is made of aluminum nitride, quartz, and the like and allows microwaves to pass through.

On the upper surface of the ceiling plate 8, there are a disc-shaped planar antenna member 10 having a thickness of several millimeters, and a slow wave member 12 made of, for example, a dielectric material in order to shorten the wavelength of the microwaves, in a radial direction of the planar antenna member 10. Above the slow wave member 12, there is a ceiling cooling jacket 14 inside of which a cooling water conduit is formed in order to allow cooling water to flow through, so that the slow wave member 12 and the like are cooled. The planar antenna member 10 has plural slots 16, which are through-holes having, for example, an oblong opening shape. Generally, the slots 16 are arranged concentrically or spirally.

An inner conductive body 20 of a co-axial waveguide pipe 18 is connected to a central part of the planar antenna member 10, so that microwaves of a frequency of, for example, 2.45 GHZ generated by a microwave generator (not shown) are guided to the central part of the planar antenna member 10. The microwaves propagate in a radial direction in the planar antenna member 10, and are downwardly radiated from the slots 16 of the planar antenna member 10 into the process chamber 4 through the ceiling plate 8. Then, the microwaves generate plasma in a process space S in the process chamber 4, so that the semiconductor wafer can undergo a predetermined plasma process such as film deposition and etching.

Patent Document 1: Japanese Patent Application Laid-Open Publication No. H3-119073,
Patent Document 2: Japanese Patent Application Laid-Open Publication No. H5-343334.
Patent Document 3: Japanese Patent Application Laid-Open Publication No. H9-181052.
Patent Document 4: Japanese Patent Application Laid-Open Publication No. 2003-59919.
Patent Document 5: Japanese Patent Application Laid-Open Publication No. 2004-14262.
Patent Document 6: Japanese Patent Application Laid-Open Publication No. 2005-100931.

SUMMARY OF INVENTION

Problem to be Solved by the Invention

When the plasma process such as film deposition, etching, and the like is carried out using the plasma apparatus described above, it is generally demanded that a plasma density is made uniform across the wafer surface in order to maintain high across-wafer uniformity. While plasma states in the process chamber are greatly affected by process conditions such as process pressure, gaseous species and the like, it is demanded that the plasma density be maintained highly uniform in-plane even when the process conditions are variously fluctuating.

To this end, attempts have been made to appropriately adjust the arrangement, the opening shape and the like of the slots 16 formed in the planar antenna member 10 in order to make the plasma density in the process chamber 4 as uniform as possible. However, it is extremely difficult to control plasma behavior in the process chamber 4, and plasma behavior may be changed by only a slight variation in the process conditions. In addition, interference may occur in microwaves radiated from adjacent slots 16. As a result, insufficient across-wafer uniformity may be inevitable in the plasma process.

The microwaves propagating through the ceiling plate 8 into the process chamber 4 are impeded by the plasma generated in the process space S and thus propagate in a planar direction as surface waves 22 below the ceiling plate 8. The surface waves 22 are turned into standing waves, which cause uneven distribution of the plasma. Therefore, it is quite difficult to realize intended plasma density distribution.

In order to address such difficulty, it has been attempted to control the plasma density by providing concave/convex portions on the upper surface of the ceiling plate, as described in Patent Documents 4 through 6. Especially, as Patent Document 6 describes, when taper-shaped concave/convex portions are provided on the lower surface of the ceiling plater the plasma density uniformity can be improved to a great extent, but the improvement is not satisfactory. Because the microwaves are greatly affected by the slot shape, the slot arrangement, and especially the surface geometry of the ceiling plate, it is difficult to optimize these factors.

As a wafer size tends to be larger from 8 inches to 12 inches and further miniaturization and thinning are promoted, the above problems are strongly required to be solved.

The present invention has been made in view of the above in order to solve such problems. The present invention is directed to a plasma process apparatus that is capable of making uniform the plasma density in a horizontal plane in a process space, and a ceiling plate to be used in the plasma process apparatus.

Means of Solving the Problems

According to a first aspect of the present invention, there is provided a ceiling plate that is provided at a ceiling portion of a process chamber that may be evacuated to a vacuum, wherein the ceiling plate allows microwaves emitted from a slot of a planar antenna member provided along with the ceiling plate to pass through the ceiling plate into the process chamber. The ceiling plate includes plural protrusion portions provided in a radial pattern on a surface of the ceiling plate, the surface facing toward an inside of the process chamber.

According to a second aspect of the present invention, there is provided a ceiling plate according to the first aspect, wherein a thickness of places where the protrusion portions are provided in the ceiling plate and another thickness of other places where the protrusion portions are not provided in the ceiling plate are determined so that the number of propagation modes of the microwaves is different in the places where the protrusion portions are provided from the number of propagation modes in the other places where the protrusion portions are not provided.

According to a third aspect of the present invention, there is provided a ceiling plate according to the first or the second aspect, wherein a width of the protrusion portions is in a range from $1/10$ through $1/2$ of a wavelength of the microwaves that propagate in the ceiling plate.

According to a fourth aspect of the present invention, there is a ceiling plate according to any one of the first through the third aspects, wherein three or more of the protrusion portions are provided in a radial pattern at equal angular intervals with a central part of the ceiling plate as a hub.

According to a fifth aspect of the present invention, there is provided a ceiling plate according to any one of the first through the fourth aspects, wherein one or more ring-shaped protrusion portions are provided on the surface facing toward the inside of the process chamber.

According to a sixth aspect of the present invention, there is provided a plasma process apparatus including a process chamber that is open at a ceiling portion and may be evacuated to a vacuum; a microwave generation portion that generates microwaves for generating plasma; a planar antenna member having plural slots that introduce the microwaves from the microwave generation portion to the process chamber, the planar antenna portion being provided at the opening at the ceiling portion; and a ceiling plate that allows the microwaves emitted from the planar antenna member to pass through the ceiling plate into the process chamber, the ceiling portion being hermetically provided at the opening at the ceiling portion, wherein plural protrusion portions are provided in a radial pattern on a surface of the ceiling plate, the surface facing toward the inside of the process chamber.

According to a seventh aspect of the present invention, there is provided a plasma process apparatus according to the sixth aspect, wherein a thickness of places where the protrusion portions are provided in the ceiling plate and another thickness of other places where the protrusion portions are not provided in the ceiling plate are determined so that the number of propagation modes of the microwaves is different in the places where the protrusion portions are provided from the number of propagation modes in the other places where the protrusion portions are not provided.

According to an eighth aspect of the present invention, there is provided a plasma process apparatus according to the sixth or the seventh aspect, wherein the protrusion portions have a width ranging from $1/10$ through $1/2$ of a wavelength of the microwaves propagating in the ceiling plate.

According to a ninth aspect of the present invention, there is provided a plasma process apparatus according to any one of the sixth through the eighth aspects, wherein three or more of the protrusion portions are provided in a radial pattern at equal angular intervals with a central part of the ceiling plate as a hub.

According to a tenth aspect of the present invention, there is provided a plasma process apparatus according to any one of the sixth through the ninth aspects, wherein one or more ring-shaped protrusion portions are provided on the surface facing toward the inside of the process chamber.

According to an eleventh aspect of the present invention, there is provided a plasma process apparatus according to any one of the sixth through the tenth aspects, wherein the protrusion portions of the ceiling plate are provided corresponding to the slots of the planar antenna member.

According to a twelfth aspect of the present invention, there is provided a ceiling plate that is provided at a ceiling portion of a process chamber that may be evacuated to a vacuum, wherein the ceiling plate allows microwaves emitted from a slot of a planar antenna member provided along with the ceiling plate to pass through the ceiling plate into the process chamber. The ceiling plate includes plural concave portions arranged in a surface of the ceiling plate, the surface facing toward an inside of the process chamber.

According to a thirteenth aspect of the present invention, there is provided a ceiling plate according to the twelfth aspect, wherein a thickness of places where the concave portions are formed in the ceiling plate and another thickness of other places where the concave portions are not formed in the ceiling plate are determined so that the number of propagation modes of microwaves is different in the places where the concave portions are formed from the number of propagation modes in the other places where the concave portions are not formed.

According to a fourteenth aspect of the present invention, there is provided a ceiling plate according to the twelfth or the thirteenth aspect, wherein the concave portions have circular top view shapes.

According to a fifteenth aspect of the present invention, there is provided a ceiling plate according to any one of the twelfth through the fourteenth aspects, wherein at least innermost concave portions among the plural concave portions are arranged along one circle with the center thereof at a central part of the ceiling plate.

According to a sixteenth aspect of the present invention, there is provided a plasma process apparatus including a process chamber that is open at a ceiling portion and may be evacuated to a vacuum; a microwave generation portion that generates microwaves for generating plasma; a planar antenna member having plural slots that introduce the microwaves from the microwave generation portion to the process chamber, the planar antenna portion being provided at the opening at the ceiling portion; and a ceiling plate that allows the microwaves emitted from the planar antenna member to pass through into the process chamber, the ceiling portion being hermetically provided at the opening at the ceiling portion, wherein plural concave portions are provided on a surface of the ceiling plate, the surface facing toward the inside of the process chamber.

According to a seventeenth aspect of the present invention, there is provided a plasma process apparatus according to the sixteenth aspect, wherein a thickness of places where the concave portions are formed in the ceiling plate and another thickness of other places where the concave portions are not formed in the ceiling plate are determined so that the number of propagation modes of microwaves is different in the places where the concave portions are formed from the number of propagation modes in the other places where the concave portions are not formed.

According to an eighteenth aspect of the present invention, there is provided a plasma process apparatus according to the sixteenth or the seventeenth aspect, wherein the concave portions have circular top view shapes.

According to a nineteenth aspect of the present invention, there is provided a plasma process apparatus according to any one of the sixteenth through the eighteenth aspect, wherein at least innermost concave portions among the plural concave portions are arranged along one circle with the center thereof at a central part of the ceiling plate.

According to a twentieth aspect of the present invention, there is provided a plasma process apparatus according to any one of the sixteenth through the nineteenth aspects, wherein innermost concave portions are formed corresponding to positions offset from the slots of the planar antenna member.

Effects of the Invention

According to embodiments of the present invention, a plasma process apparatus is provided that is capable of making uniform the plasma density in a horizontal plane in a process space, and a ceiling plate to be used in the plasma process apparatus.

Figure 1:
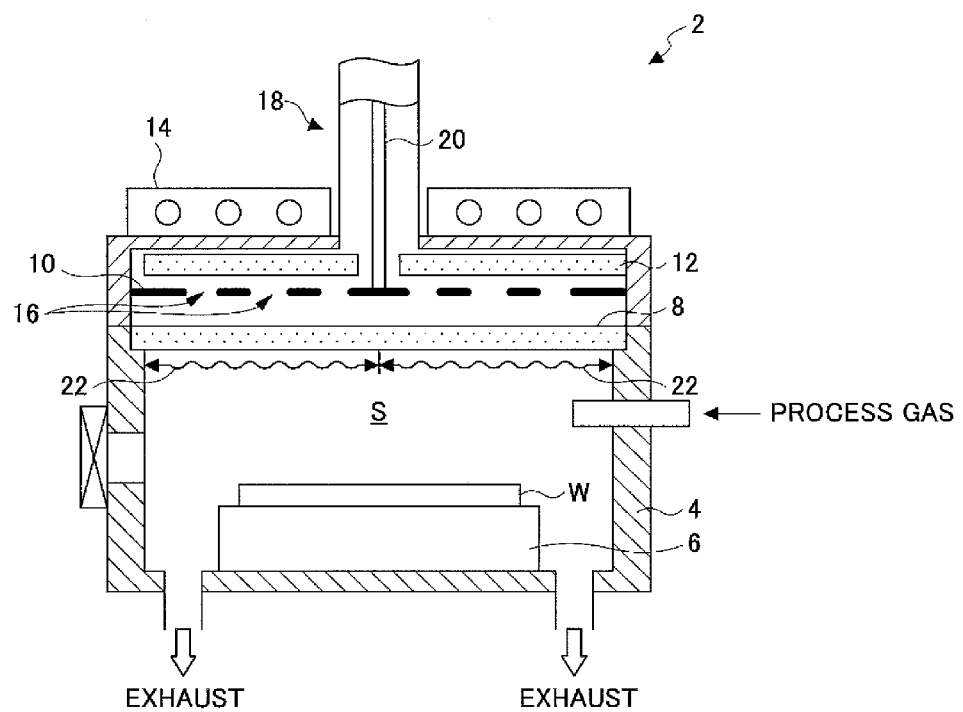
FIG. 1 is a schematic configuration view showing a related art plasma process apparatus.

DESCRIPTION OF THE REFERENCE NUMERALS 32 plasma process apparatus
34 process chamber
36 susceptor
40 gas supplying portion
56 ceiling plate
60 microwave propagation control protrusion portion
62 circular protrusion portion
64 planar antenna member
78 microwave generator (microwave generation portion)
92 microwave propagation control concave portion
W semiconductor wafer (object to be processed)

Modes(s) for Carrying Out the Invention

Referring to the accompanying drawings, a plasma process apparatus and a ceiling plate to be used in the plasma process apparatus according to embodiments of the present invention will be described.

Figure 2:
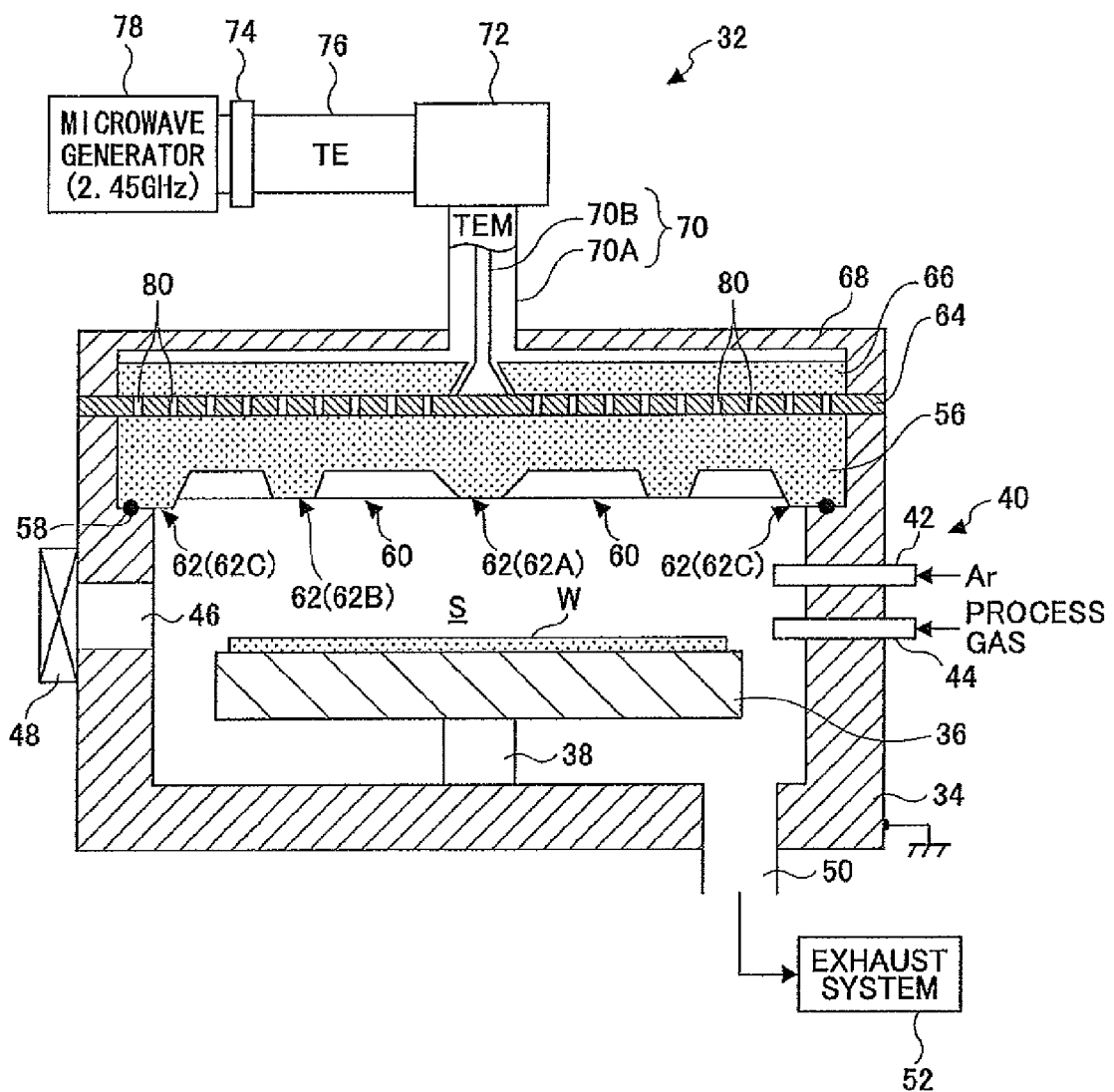
FIG. 2 is a configuration view showing a plasma process apparatus according to an embodiment of the present invention.
Figure 3:
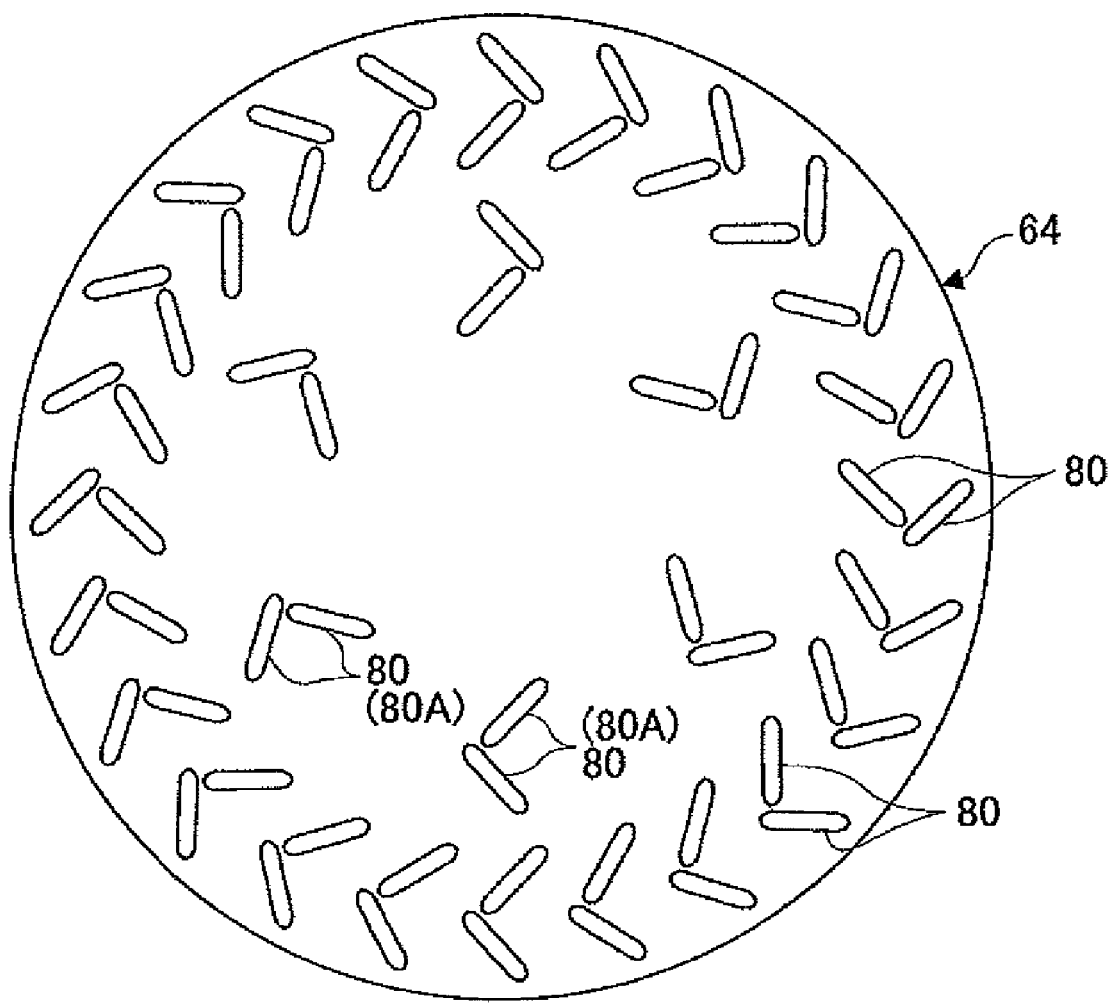
FIG. 3 is a plan view showing a planar antenna member of the plasma process apparatus shown in FIG. 2.
Figure 4:
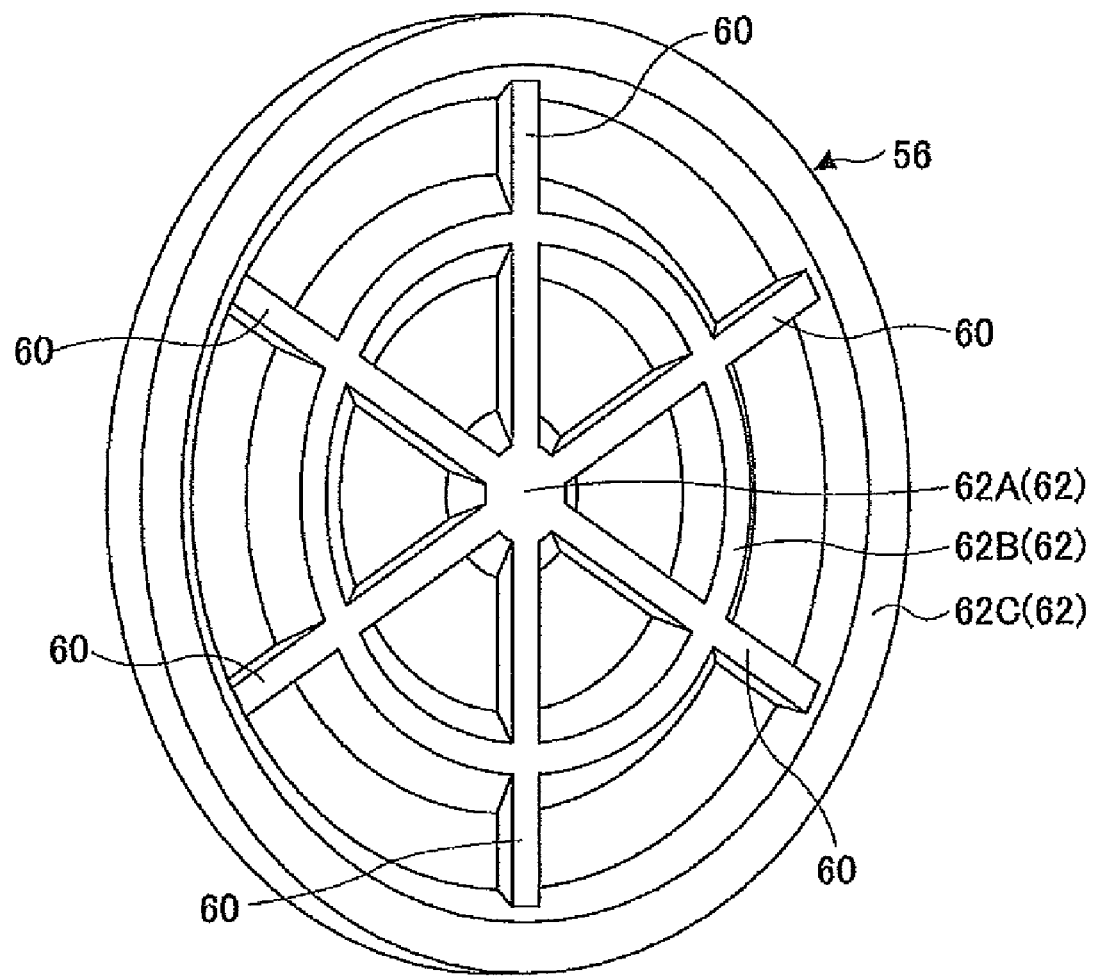
FIG. 4 is a perspective view showing a ceiling plate according to an embodiment of the present invention.
Figure 5:
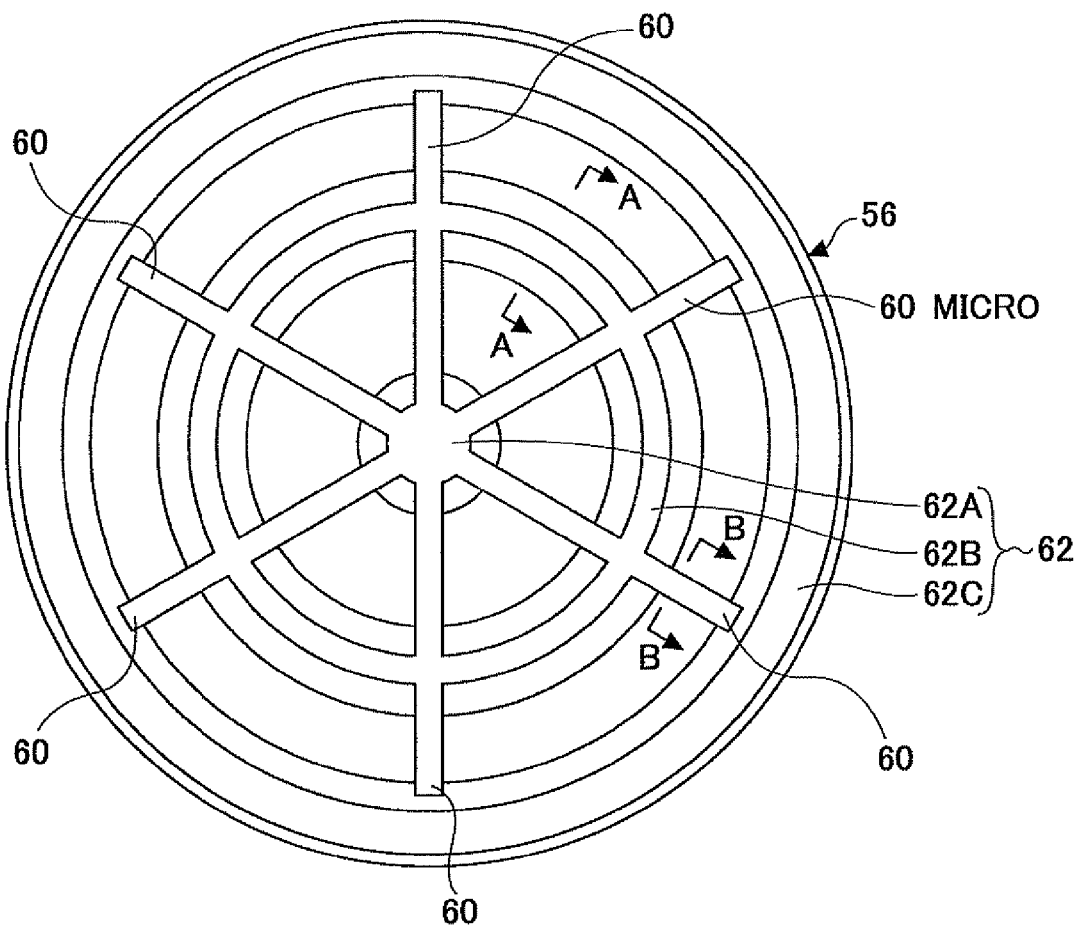
FIG. 5 is a plan view of the ceiling plate shown in FIG. 4.
Figure 6A:
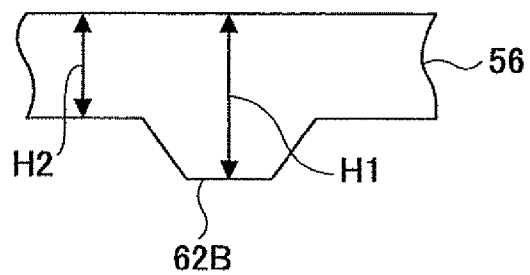
FIG. 6A is a cross-sectional view taken along an A-A line in FIG. 5.
Figure 6B:
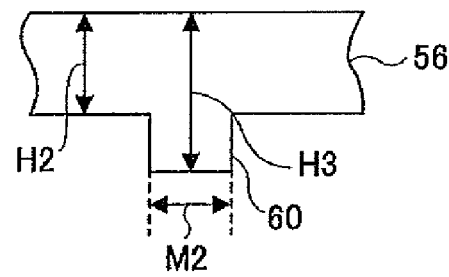
FIG. 6B is a cross-sectional view taken along a B-B line in FIG. 5.
Figure 7:
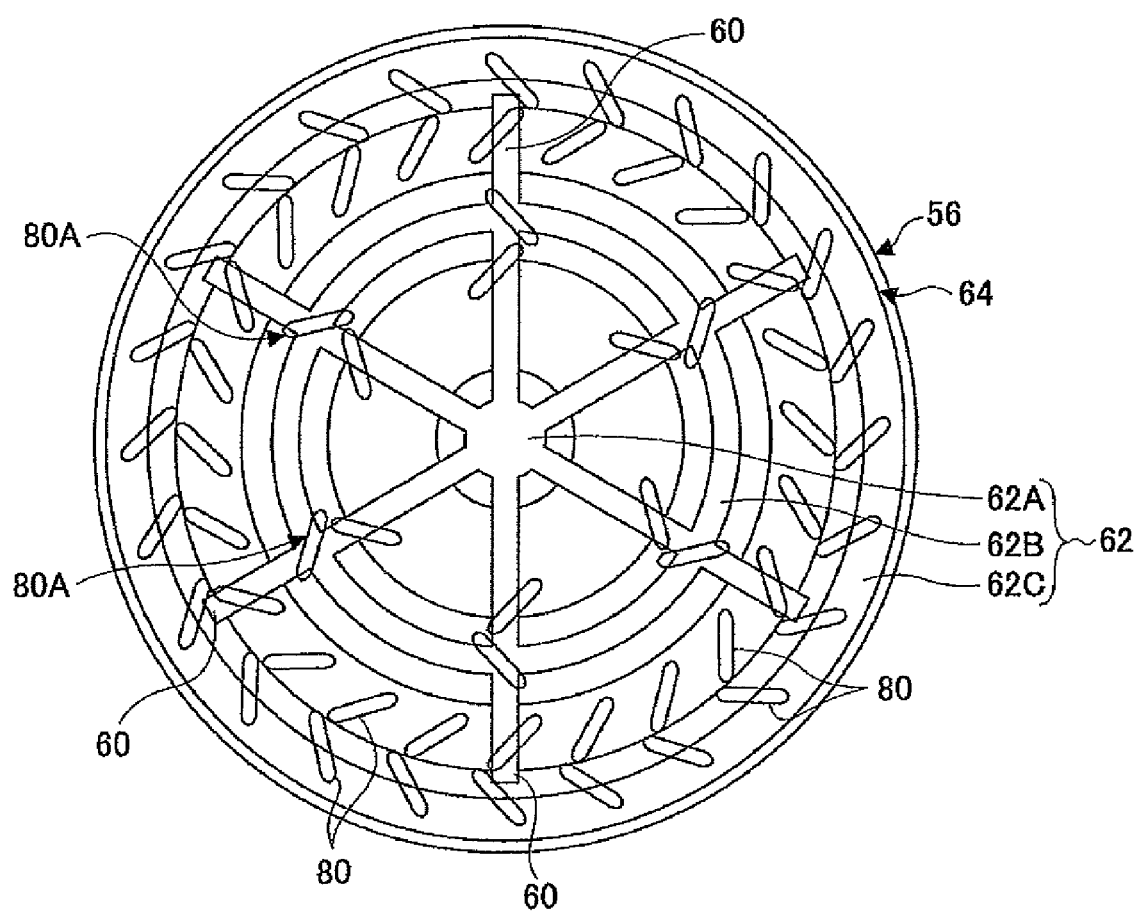
FIG. 7 is a view for explaining a positional relationship between the ceiling plate and slots of the planar antenna member.

FIG. 2 is a schematic view illustrating the plasma process apparatus according to an embodiment of the present invention; FIG. 3 is a plan view of a planar antenna member of the plasma process apparatus shown in FIG. 2; FIG. 4 is a perspective view of the ceiling plate according to an embodiment of the present invention; FIG. 5 is a plan view of the ceiling plate shown in FIG. 4; FIG. 6A is a cross-sectional view taken along the A-A line in FIG. 5; FIG. 6B is a cross-sectional view taken along the B-B line in FIG. 5; and FIG. 7 is an explanatory view for explaining a special relationship between the ceiling and the planar antenna member.

As shown, a plasma process apparatus 32 has a process chamber 34 whose side wall and bottom portion are made of an electrically conductive material such as an aluminum alloy and the like and that has a tubular shape, for example, a circular cylinder shape as a whole. The inside of the process chamber 34 is defined as a hermetically-closed process space S, in which plasma is generated. The process chamber 34 is grounded.

A susceptor 36 on which an object to be processed, for example, a semiconductor wafer W is placed is housed inside the process chamber 34. The susceptor 36 is formed of ceramics, alumite-treated aluminum alloys, and the like into a substantial disc-shape having flat faces. In addition, the susceptor 36 is supported by a column 38 that stands on the bottom portion of the process chamber 34. The column 38 is made of, for example, an insulating material.

An electrostatic chuck or a clamp mechanism (not shown) is provided on the upper surface of the susceptor 36 in order to hold the wafer W. The susceptor 36 may be connected to a high frequency power source for biasing at a frequency of, for examples 13.56 MHz. Additionally, a heater may be provided in the susceptor 36, if necessary.

A plasma gas supplying nozzle 42 made of quartz for supplying plasma gas, for example, argon gas into the process chamber 34 and a process gas supplying nozzle 44 made of quartz for supplying process gas, for example, deposition gas into the process chamber 34 are provided as a gas supplying portion 40 in the side wall of the process chamber 34. These gases are flow-controlled and supplied to the process chamber 34 through the corresponding nozzles 42, 44. Alternatively, a quartz shower head and the like may be provided above the susceptor 36 as the gas supplying portion 40.

In addition, a wide opening 46 is made in the side wall of the process chamber 34. A gate valve 48, which is opened/closed when the wafer W is transferred into/out from the process chamber 34, is attached to the opening 46. Moreover, an exhaust opening 50 is provided in the bottom portion of the process chamber 34, and an exhaust system 52 including a vacuum pump and a pressure control valve (not shown) is connected to the exhaust opening 50. With this configuration, the process chamber 34 can be evacuated to a predetermined pressure, when desired.

The process chamber 34 has an opening at the top, and a ceiling plate 56 is provided at the opening. The ceiling plate 56 is formed of quartz, ceramics and the like having microwave permeability, and hermetically closes the opening of the process chamber 34 via sealing members 58 such as O-rings.

The ceiling plate 56 may be about 20 mm thick, taking account of pressure resistance. The lower surface of the ceiling plate 56, which is a surface facing toward the inside of the process chamber 34, is provided with a circular protruding portion 62 and microwave propagation control protruding portions 60 for controlling propagation of the microwaves. The ceiling plate 56 is described again later.

A planar antenna member 64 is provided on the ceiling plate 56, and a slow wave member 66 is provided on the planar antenna member 64. Specifically, the planar antenna member 64 serves as a bottom plate of a waveguide box 68 that provides a hollow cylinder-shaped chamber in order to entirely cover the slow wave member 66. The planar antenna member 64 opposes the susceptor 36 in the process chamber 34, with the ceiling plate 56 arranged in between.

The waveguide box 68 and the planar antenna member 64 are grounded at their peripheral portions. An outer pipe 70A of a co-axial waveguide pipe 70 is connected to an upper central part of the waveguide box 68. An inner conductive body 70B of the co-axial waveguide pipe 70 is connected to a central part of the planar antenna member 64 through a through-hole at the center of the slow wave member 66. The co-axial pipe 70 is connected to a microwave generator (microwave generation portion) 78 that generates microwaves of, for example, 2.45 GHz via a mode converter 72 and a rectangular waveguide pipe 76 having a matching portion 74 in the middle, in this order. With this configuration, the microwaves propagate from the microwave generator 78 to the planar antenna member 64. The mode converter 72 may be inserted in the middle of the waveguide pipe composed of the rectangular waveguide pipe 76 and the co-axial waveguide pipe 70.

The microwave generator 78 emits microwaves of, for example, a transverse electric (TE) mode, and the TE mode is converted to, for example, a transverse electric magnetic (TEM) mode by the mode converter 72. Then, the microwaves of the TEM mode propagate through the co-axial waveguide 70. The frequency of the microwaves is not limited to 2.45 GHz, but may be 8.35 GHz and the like. A ceiling cooling jacket (not shown) may be provided on the upper portion of the waveguide box 68.

The planar antenna member 64 is made of an electrically conductive material, for example, a copper or aluminum plate whose surface is silver electroplated and that has a thickness of 1 through several millimeters and a diameter of 300 through 400 mm when an 8-inch wafer is processed in the process chamber 34. In the planar antenna member 64, plural slots 80 are formed which are through-holes having an oblong opening shape, as shown in FIG. 3. An arrangement of the slots 80 is not limited. For example, the slots 80 may be arranged concentrically, spirally, radially, or evenly throughout the planar antenna member 64. As shown in FIG. 3, two individual slots 80 are arranged apart from each other with a slight distance between them in order to substantially form an L-shape, thereby constituting a pair of slots 80. In an inner portion of the planar antenna member 64, six of the pairs of slots 80 are arranged along an inner circle (not shown). In an outer portion of the planar antenna member 64, twenty-four of the pairs of slots 80 are arranged along an outer circle (not shown), which is concentric to the inner circle. The pair of slots 80 may have a T-shape.

Next, the ceiling plate 56 arranged below the planar antenna member 64 is described. As stated above, the microwave propagation control protruding portions 60 and the circular protruding portion 62 are provided on the surface of the ceiling plate 56, the surface facing toward the inside of the process chamber 34, or the lower surface, so that the protruding portions 60, 62 protrude downward. The circular protruding portion 62 is capable of controlling mainly the microwaves propagating in a radial direction of the ceiling plate 56. The radial microwave propagation control protruding portions 60 are capable of mainly controlling the microwaves propagating in a circumferential direction (perpendicular to the radial direction) of the ceiling plate 56. Due to a synergetic effect of these protruding portions 62, 60, the in-plane plasma uniformity is expected to be greatly improved.

As shown in FIGS. 4 through 6, the circular protruding portion 62 includes a truncated cone shaped circular protruding portion 62A that is located at the central part of the ceiling plate 56, a ring-shaped circular protruding portion 62B that is located at a middle circumferential portion of the ceiling plate 56 and has a trapezoid cross section, and another ring-shaped circular protruding portion 62C that is located at a circumference portion of the ceiling plate 56. The circular protruding portions 62A, 62B, 62C may be formed as necessary, or formed when the plasma density needs to be raised where the plasma is less dense. In addition, the circular protruding portion 62 may have either one of the circular protruding portions 62A through 62C, or two or an additional one, if necessary.

In FIG. 6A, which is a cross-sectional view taken along the A-A line in FIG. 5, a thickness H1 of a place where the circular protruding portion 62B is present and a thickness H2 of a place where the circular protruding portion 62B is absent, which corresponds to a thickness of the ceiling plate 56 per se, are determined so that the number of propagation modes (propagation mode types) of the microwaves propagating in the place where the circular protruding portion 62B is present is different from the number of the propagation modes of the microwaves propagating in the place where the circular protruding portion 62B is absent. When the microwaves irradiated from the slots 80 (FIG. 3) of the planar antenna member 64 propagate in the ceiling plate 56, the microwaves are repeatedly reflected in the ceiling plate 56, so that a standing wave is generated. The ring-shaped circular protruding portion 62C located at the position near the circumference of the ceiling plate 56 is slightly thicker than the ring-shaped circular protruding portion 62B located at the middle circumference of the ceiling plate 56 in order to enhance the microwaves at the circumferential portion.

In this situation, two types of propagation modes of TM0 mode and TE1 mode can propagate in the place having the thickness of H1, while one mode of TM0 mode can propagate in the place having the thickness of H2. Therefore, microwave intensity becomes greater in the place having the thickness of H1 where the TM0 mode and the TE1 mode can propagate, thereby enhancing the plasma density in the place having the thickness of H1.

A width M1 of the circular protruding portion 62B (an average value of the upper and the lower base of the trapezoid) is not limited, but preferably in a range from $\lambda/10$ to $\lambda/2$, where $\lambda$ is the wavelength of the microwaves propagating in the ceiling plate 56. While the microwaves radiated from the slots 80 propagate in the radial and the circumferential directions, the microwaves propagating in the radial direction are predominant. In other words, the propagation intensity of the microwaves is greater in the radial direction than in the circumferential direction. Therefore, the circular protruding portion 62 that controls mainly the microwaves propagating in the radial direction has preferably a taper-shaped (trapezoid-shaped) cross section in order to avoid an abrupt change in the electric field distribution, thereby improving the in-plane uniformity of the plasma density. The propagation modes of the microwaves in the circular protruding portion 62B are the same the number of propagation modes in the circular protruding portions 62A, 62C.

Referring to FIG. 5, the plural microwave propagation control protruding portions 60 are provided in a radial pattern with the central part of the ceiling plate 56 as a hub. In the illustrated example, the six microwave propagation control protruding portions 60 are arranged at the same angular intervals. The number of the microwave propagation control protruding portions 60 is arbitrarily determined, but preferably three or more. While only two microwave propagation control protruding portions 60 are less effective, it is more preferable that the four or more microwave propagation control protruding portions 60 are arranged at the same angular intervals. As shown in FIG. 6B, which is a cross-sectional view taken along the B-B line in FIG. 5, the microwave propagation control protruding portions 60 have a rectangular cross section. The microwave propagation control protruding portions 60 may have a trapezoid-shaped cross section.

A thickness of a place where the microwave propagation control protruding portions 60 are present is determined in the same or similar manner as the thickness of the place where the circular protruding portion 62B is determined as shown in reference to FIG. 6A.

In FIG. 6B, a thickness H3 of the place where the microwave propagation control protruding portions 60 are present and a thickness H2 of a place where the microwave propagation control protruding portions 60 are absent, which corresponds to the thickness of the ceiling plate 56 per se, are determined so that the number of propagation modes of the microwaves propagating in the place where the microwave propagation control protruding portions 60 are present are different from the number of the propagation modes of the microwaves propagating in the place where the microwave propagation control protruding portions 60 are absent. When the microwaves irradiated from the slots 80 of the planar antenna member 64 propagate in the circumferential direction (direction orthogonal to the radial direction) of the ceiling plate 56, the microwaves are repeatedly reflected in the ceiling plate 56, so that a standing wave is generated.

In this situation, two types of propagation modes of the TM0 mode and TE1 mode may propagate in the place having the thickness of H3, while only one mode of the TM0 mode may propagate in the place having the thickness of H2. Therefore, microwave intensity becomes greater in the place having the thickness of H3 where the TM0 mode and the TE1 mode microwaves may propagate, thereby enhancing the plasma density in the place having the thickness of H3. A width M2 of the microwave propagation control protruding portions 60 (in the case of the trapezoid cross section, an average value of the upper and the lower base of the trapezoid) is not limited, but preferably in a range from $\lambda/10$ to $\lambda/2$, where $\lambda$ is the wavelength of the microwaves propagating in the ceiling plate 56. When the width M2 is less than $\lambda/10$ or greater than $\lambda/2$, the microwave propagation control protruding portions 60 cannot produce a sufficient effect.

A difference in the number of propagation modes between the places where the microwave propagation control protruding portions 60 are present and absent is preferably determined to be one or two When the difference in the number of the modes is three or greater, the electric field distribution can be adjusted to a lesser extent, resulting in a lesser effect produced by the microwave propagation control protruding portions 60. In the illustrated example, the thickness H1 and the thickness H3 are determined to be the same. In addition, the thickness H3 is about 25 mm, and the thickness H2 is about 17 mm, in this embodiment.

In this embodiment, the six microwave propagation control protruding portions 60 are positioned corresponding to the positions of the slots 80 of the planar antenna member 64 placed on the ceiling plate 56, as shown in FIG. 7. Specifically, the plural pairs of the slots 80, each individual slot of which is arranged slightly apart from the other in order to form a L-shape, are concentrically arranged in the planar antenna member 64, and the microwave propagation control protruding portions 60 are positioned corresponding to the positions of the pairs of the slots BOA arranged along the inner circle. The reason for such an arrangement is that the microwaves radiated from the inner slots 80A are preferably efficiently controlled by the microwave propagation control protruding portions 60 because the electric field intensity of the microwaves propagating in the circumferential direction of the ceiling plate 56 is greater in the inner portion than in the outer portion of the ceiling plate 56.

Figure 8:
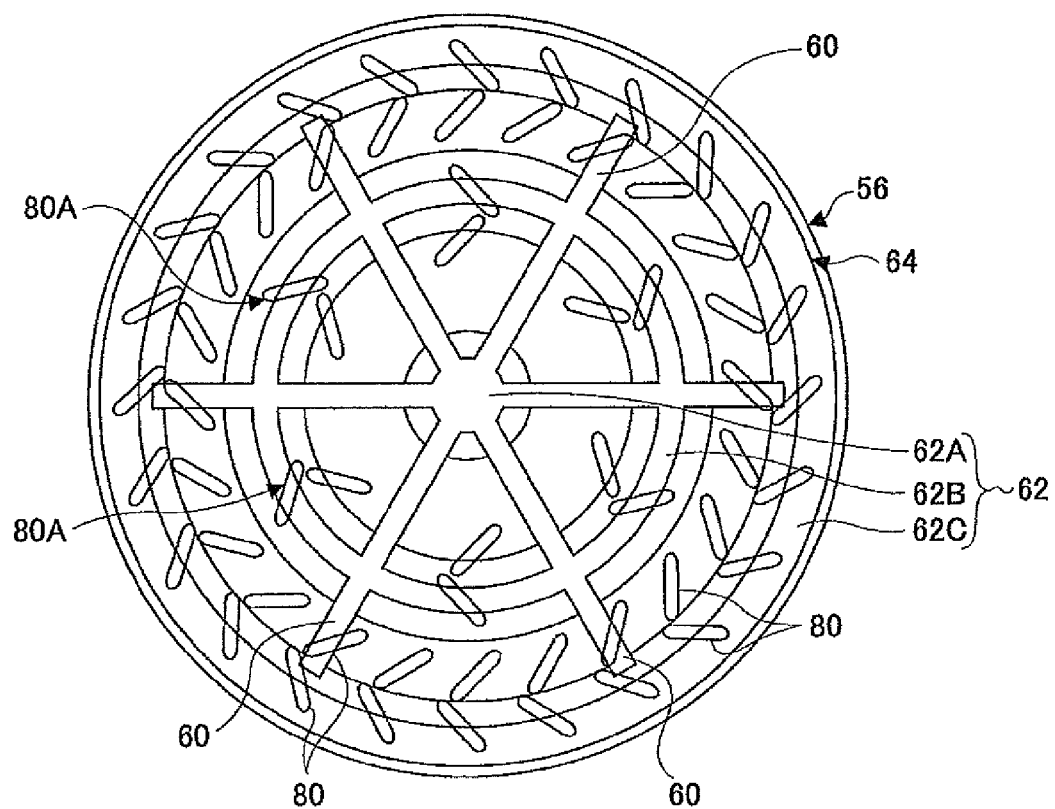
FIG. 8 is a view for explaining another positional relationship between the ceiling plate and slots of the planar antenna member.

However, the six microwave propagation control protruding portions 60 may be positioned between every two of the adjacent pairs of the slots 80A, as shown in FIG. 8. Specifically, the arrangement shown in FIG. 8 is obtained by rotating the six microwave propagation control protruding portions 60 shown in FIG. 7 by about 30 degrees in the circumferential direction. Even in such an arrangement, the microwave propagation control protruding portions 60 may produce an effect to control the microwaves propagating in the circumferential direction of the ceiling plate 56.

Next, a process method carried out using the plasma process apparatus 32 configured above is explained.

First, a semiconductor wafer W is transferred into the process chamber 34 through the gate valve 48 by a transfer arm (not shown) and then placed on the upper surface of the susceptor 36 by moving up and down the lifter pins (not shown).

Then, the inside of the process chamber 34 is maintained at a pressure of, for example, 0.01 through 10 Pa, In addition, Ar gas is supplied from the plasma gas supplying nozzle 42, and process gas, for example, film deposition gas when film deposition is carried out or etching gas when etching is carried out, is supplied from the process gas supplying nozzle 44 while controlling the flow rates of these gases.

At this time, the microwaves generated by the microwave generator 78 are supplied to the planar antenna member 64 through the rectangular waveguide pipe 76 and the co-axial waveguide pipe 70, and then the microwaves whose wavelength is shortened by the slow wave member 66 are introduced into the process space S, thereby dissociating the Ar gas into plasma in the process space S, in which a predetermined process is carried out.

The TE mode microwaves having a frequency of, for example, 2.45 GHz generated by the microwave generator 78 propagate through the rectangular waveguide pipe 76, and then are converted into the TEM mode by the mode converter 72. The TEM mode microwaves propagate through the co-axial waveguide pipe 70 and reach the planar antenna member 64 in the waveguide box 68, as explained above. Next, the microwaves propagate radially from the central part of the planar antenna member 64, to which the inner conductive body 70B is connected, toward the circumference of the planar antenna member 64. At this time, the microwaves are radiated from the plural slots 80 formed in the planar antenna member 64. After this, the microwaves propagate in the radial direction and also in the circumferential direction (a direction orthogonal to the radial direction) in the ceiling plate 56. While propagating through the ceiling plate 56, the microwaves penetrate downward through the ceiling plate 56 and are introduced into the process space S. The microwaves excite the Ar gas into plasma, which in turn spreads downward and activates the process gas to produce active species, by which the top surface of the wafer W is processed.

If the ceiling plate has a flat surface like the ceiling plate 8 used in the related art apparatus, the standing wave is produced by the microwaves propagating in a planar direction of the ceiling plate 8, which causes variations in the plasma density and interference. Therefore, the in-plane plasma density in the process chamber 4 (FIG. 1) may be greatly varied by only a slight change in the process conditions. As a result, the in-plane properties of the plasma process are adversely affected.

On the other hand, regarding the microwaves radially propagating from the central part of the ceiling plate 56, the thickness H1 of the place where the circular protruding portion 62 is present and the thickness H2 of the place where the circular protruding portion 62 is absent are determined so that there is a distribution pattern of the electromagnetic field of the propagating microwaves, i.e., the number of the propagation modes is different in the place where the circular protruding portion 62 is present from the number of propagation modes in the place where the circular protruding portion 62 is absent (see FIG. 6A).

In other words, the thicknesses H1 and H2 are determined so that the microwaves propagating in the place where the circular protruding portion 62 is provided in the ceiling plate 56, the place having the thickness of H1, have a different number of propagation modes from the number of propagation modes of the microwaves propagating in the place where the circular protruding portion 62 is not provided. For example, two modes (microwaves TM0 of the TM0 mode and microwaves TE1 of the TE1 mode) can propagate in the place having the thickness of H1, whereas only one mode (microwaves TM0 of the TM0 mode) can propagate in the place having the thickness of H2. Therefore, the microwave intensity can be increased in the place having the thickness of H1 where the microwaves TM0, TE1 can propagate, rather than in the place having the thickness of H2 where only the microwaves TM0 can propagate, thereby increasing the plasma density in the place having the thickness of H1.

While the plasma density tends to be lower in the middle circumferential portion and the circumferential portion in the generic flat ceiling plate 8 shown in FIG. 1, because the circular protruding portion 62 is provided in the middle circumferential portion and the circumferential portion of the ceiling plate 56, the microwave intensities are enhanced and thus the plasma densities are increased in the circumferential portions, according to this embodiment of the present invention. Therefore, the plasma uniformity is improved in a wafer surface direction (a planar direction in the process space S).

Regarding the microwaves propagating in the circumferential direction (direction orthogonal to the radial direction) of the ceiling plate 56, the thickness H3 of the place where the microwave propagation control protruding portions 60 are present and the thickness H2 of the place where the microwave propagation control protruding portions 60 are absent are determined so that there is distribution pattern of the electromagnetic field of the propagating microwaves, i.e., the number of the propagation modes is different in the place where the microwave propagation control protruding portions 60 are present from the number of propagation modes in the place where microwave propagation control protruding portions 60 are absent (see FIG. 6B).

In other words, the thicknesses H3 and H2 are determined so that the microwaves propagating in the place where the microwave propagation control protruding portions 60 are provided in the ceiling plate 56, the place having the thickness of H3, have a different number of propagation modes from the number of propagation modes of the microwaves propagating in the place where the microwave propagation control protruding portions 60 are not provided.

For example, two modes (the microwaves TM0 of the TM0 mode and the microwaves TE1 of the TE1 mode) can propagate in the place having the thickness of H3, whereas only one mode (the microwaves TM0 of the TM0 mode) can propagate in the place having the thickness of H2. Therefore, the microwave intensity can be increased in the place having the thickness of H3 where the microwaves TM0, TE1 can propagate, rather than in the place having the thickness of H$_2$ where only the microwaves TM0 can propagate, thereby increasing the plasma density in the place having the thickness of H3.

Therefore, the intensity of the microwaves propagating in the circumferential direction of the ceiling plate 56 can be controlled, thereby improving the in-plane plasma density regardless of the process conditions such as the process pressure, gaseous species and the like. Especially, when the microwave power is lower, the plasma density variation can be reduced.

As stated, because the ceiling plate 56 is configured to have the plural microwave propagation control protruding portions 60 in a radial pattern on the surface facing toward the inside of the process chamber 34 in order to control the microwave propagation, the microwaves propagating in the circumferential direction of the ceiling plate 56 can be controlled, thereby making uniform the plasma density in a horizontal plane in the process space S.

Moreover, because both the circular protruding portion 62 and the microwave propagation control protruding portions 60 are provided in the ceiling plate 56, not only the microwaves propagating in the circumferential direction but also the microwaves propagating in the radial direction can be controlled, and the plasma density in a horizontal plane in the process space S can be made further uniform due to synergetic effect of the portions 60, 62.

In the above example, only the microwave propagation control protruding portions 60 may be provided without the circular protruding portion 62. Even in this case, because the microwaves propagating in the circumferential direction can be controlled, the in-plane plasma density can be improved to a greater extent when compared with the flat ceiling plate 8 in the related art apparatus (FIG. 1).

Figure 9:
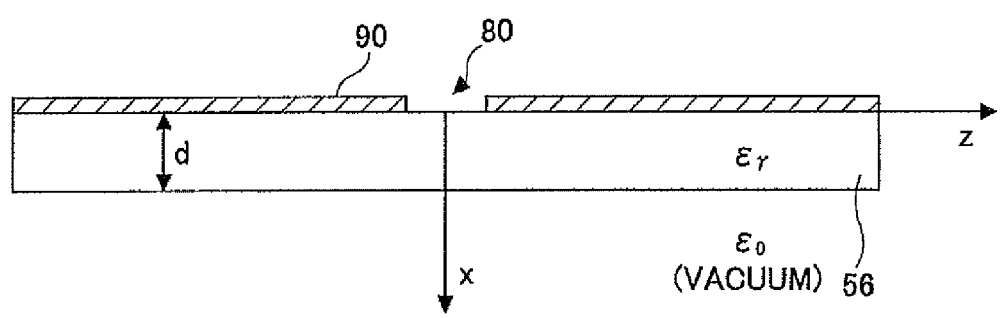
FIG. 9 shows a ceiling plate model used for simulation of microwave propagation.
Figure 10:
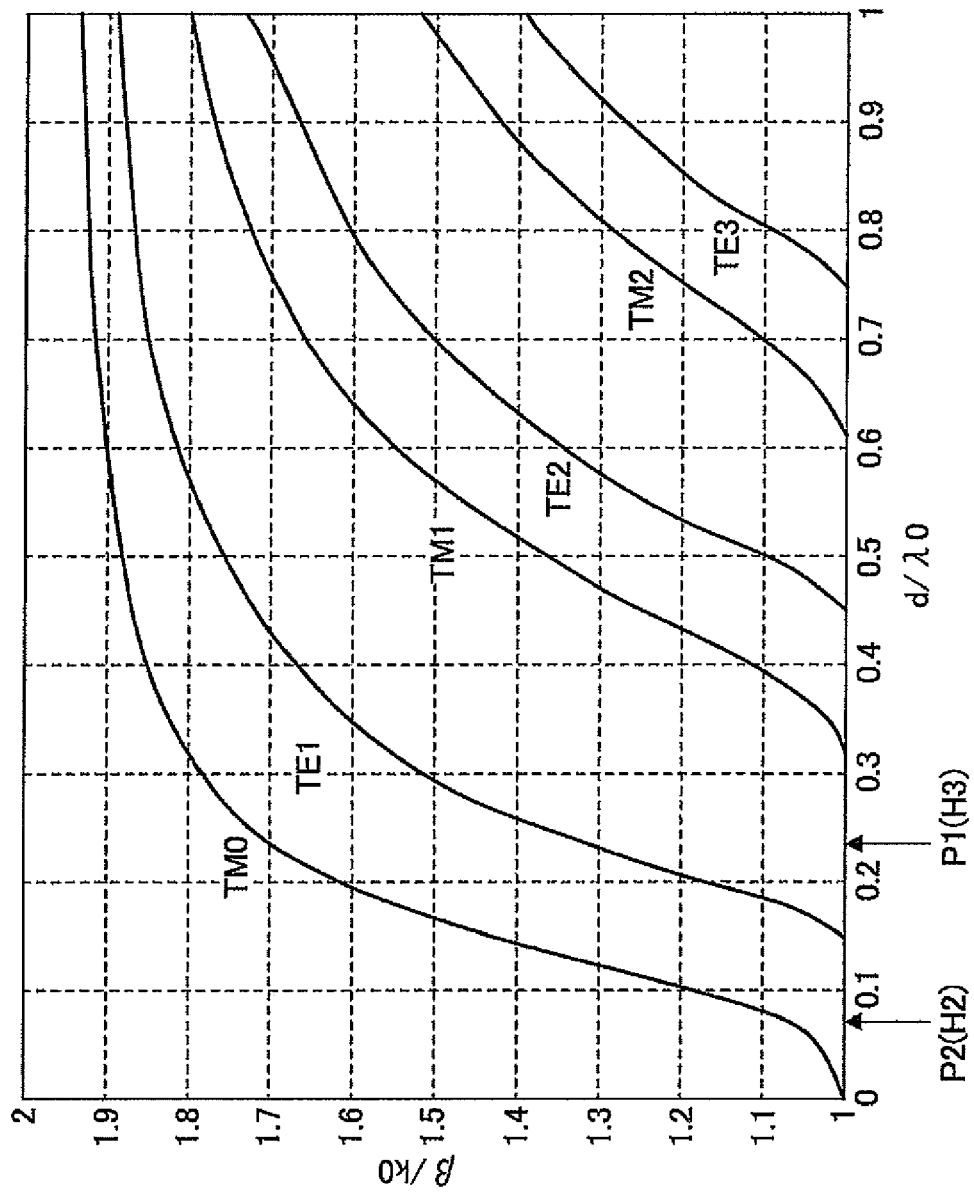
FIG. 10 is a graph showing effects made on microwave propagation mode by a thickness of the ceiling plate and microwave propagation constants.

Next, the microwave propagation in the circular protruding portion 62 and the microwave propagation control protruding portions 60 are described in reference to FIGS. 9 and 10. FIG. 9 shows a ceiling plate model used for simulation of the microwave propagation. FIG. 10 is a graph illustrating effects made on the microwave propagation modes by the ceiling plate thickness and propagation constants.

Referring to FIG. 9, a ground plate 90 having a slot 80 is coupled to a ceiling plate 56 made of a dielectric material in this model. It is assumed that the microwaves propagate as a surface wave at a boundary between the ceiling plate 56 and the vacuum and attenuate exponentially away from the surface of the dielectric material. In addition, the ceiling plate 56 is assumed to indefinitely extend in a perpendicular direction (direction perpendicular to paper surface).

Legends of the Figure are:
Z: propagation direction
x: direction orthogonal to the surface of the dielectric material (ceiling plate)
$\epsilon_r$: relative permittivity of the dielectric material (ceiling plate)
$\epsilon_o$: permittivity of the vacuum
d: thickness of the dielectric material From this model, the thickness limitation for the TM and the TE mode propagations are obtained. The thickness limitation is expressed by the following equations (1).

$$\left(\frac{\partial^2}{\partial x^2} + \varepsilon_r k_0^2 - \beta^2\right) e_z(x, y) = 0 \quad \text{for } 0 \le x \le d$$
$$\left(\frac{\partial^2}{\partial x^2} + k_0^2 - \beta^2\right) e_z(x, y) = 0 \quad \text{for } d \le x < \infty \quad (1)$$

Here, $$E_z(x, y, z) = e_z(x, y) e^{-j\beta z}$$

$\beta$ is the propagation constant

The TM mode boundary conditions are expressed by the following equations (2).

$$\begin{aligned} E_z &= 0 & x &= 0 \\ E_z &< \infty & x &\to \infty \\ E_z \text{ continuous} & & x &= d \\ H_y \text{ continuous} & & x &= d \\ H_x &= E_y = H_z = 0 & & \end{aligned} \quad (2)$$

In addition, the TE mode boundary conditions are expressed by the following equations (3).

$$\begin{aligned} E_y &= 0 & x &= 0 \\ E_y &< \infty & x &\to \infty \\ E_y \text{ continuous} & & x &= d \\ H_z \text{ continuous} & & x &= d \\ E_x &= H_y = E_z = 0 & & \end{aligned} \quad (3)$$

By analyzing the above model, a graph shown in FIG. 10 is obtained. In FIG. 10, "$d/\lambda_0$" is taken along the horizontal axis and "$\beta/\lambda_0$" is taken along the vertical axis. TM0, TM1, TM2, TE1, TE2, and TE3 modes of the microwaves are subjected to the analysis. Because "d" is the thickness of the ceiling plate 56 and "$\lambda_0$" is the wavelength of the microwaves in vacuum, "$d/\lambda_0=1$" means that the ceiling plate 56 has the thickness corresponding to one wavelength of the microwaves. For example, $\lambda_0$ is about 122 nm in the case of the microwaves of 2.45 GHz.

Although FIG. 10 shows the calculation results obtained on the assumption that the ceiling plate 56 is made of quartz (relative permittivity $\varepsilon_r$=3.78), a similar characteristic in FIG. 10 is obtained, even if the values are different, when the ceiling plate 56 is made of different materials, such as alumina.

In addition, $\beta$ is the propagation constant of the microwaves, $k_0$ is the wave number, and thus "$\beta/k_0$" is a normalized (standardized) propagation constant. While larger values along the vertical axis indicate that the microwaves can efficiently propagate, the microwaves attenuate to a greater extent so that propagation no longer takes place in a region of "$\beta/k_0 \le 1$". Namely, an intersecting point of each of the curves corresponding to the propagation modes against "$\beta/k_0=1$" indicates a cut-off thickness of the propagation mode concerned.

For example, because the TM0 mode curve intersects the "$\beta/k_0=1$" at "$d/\lambda_0=0$", the cut-off thickness d is zero (d=0).

Namely, the TM0 mode microwaves can propagate through the ceiling plate 56 regardless of the thickness.

Additionally, because the TE1 mode curve intersects the "$\beta/k_0=1$" at "$d/\lambda_0 \approx 0$", the cut-off thickness d is "18.3 mm" (d=0.15×$\lambda_0$). Namely, when the thickness d of the ceiling plate 56 becomes 18.3 mm or smaller, the TE1 mode microwaves cannot propagate, while the microwaves of the TM0 mode can propagate.

Moreover, when the ceiling plate thickness d (=61 mm) is determined so that "$d/\lambda_0$" equals to 0.5, the four types of the TM0, TE1, TM1, and TE2 modes can propagate through the ceiling plate 56, but the microwaves of the TM2 and TE3 modes cannot propagate. As stated, when the thickness d is changed in part in the ceiling plate 56, the microwaves of the propagation mode(s) corresponding to the thickness d are allowed to propagate.

More accurate values of the intersecting points of the curves corresponding to the propagation modes (of the microwaves propagating through quartz of the relative permittivity "3.78") at the "$\beta/k_0=1$" in FIG. 10 are listed as follows. TM0 mode: zero, TE1 mode: 0.1499, TM1 mode: 0.2999, TE2 mode: 0.4498, TM2 mode: 0.5998, and TE3 mode: 0.7497.

When the ceiling plate 56 is formed of alumina having a relative permittivity of "9.8", the values of the intersecting points of the curves corresponding to the propagation modes at the "$\beta/k_0=1$" are as follows. TM0 mode: 0, TE1 mode: 0.0843, TK1 mode: 0.1685, TE2 mode: 0.2528, TM2 mode: 0.3371, and TE3 mode: 0.4214.

In this embodiment, the thickness H3 of the place where the microwave propagation control protruding portions 60 are provided in a radial pattern (FIG. 6B) is determined to be equal to a point P1 that falls within a range from an intersecting point "0.15" of the TE1 mode curve with the horizontal axis to an intersecting point "0.3" of the TM0 mode curve with the horizontal axis, and the thickness H2 of the ceiling plate 56 per se (FIG. 6B) is determined to equal to a point P2 that falls within a range from an intersecting point "0" of the TM0 mode curve with the horizontal axis to an intersecting point "0.15" of the TE1 mode curve with the horizontal axis in FIG. 10. With this, regarding the microwaves propagating in the radial direction of the ceiling plate 56, the two modes (the TE1 mode and the TM0 mode) can propagate in the place having the thickness of H3, and only one mode (the TM0 mode) can propagate in the place having the thickness of H2. Namely, the number of microwave modes is different depending on the places. The difference is 1 mode in this embodiment.

The points P1, P2 in FIG. 10 are arbitrarily set, and the number of propagable modes (mode types) may be changed depending on the positions of the points P1, P2. The microwaves having the propagation modes that need to be input to the planar antenna member 64 may be produced by mode conversion using the mode converter 72 when the slow wave member 66 and the co-axial waveguide pipe 70 are not used.

Figure 11A:
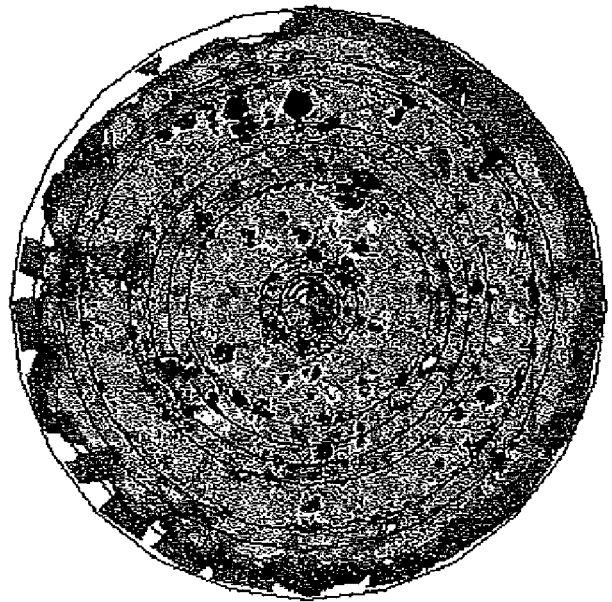
FIG. 11A shows simulation results of electric field distribution according to the ceiling plate of an embodiment of the present invention.
Figure 11B:
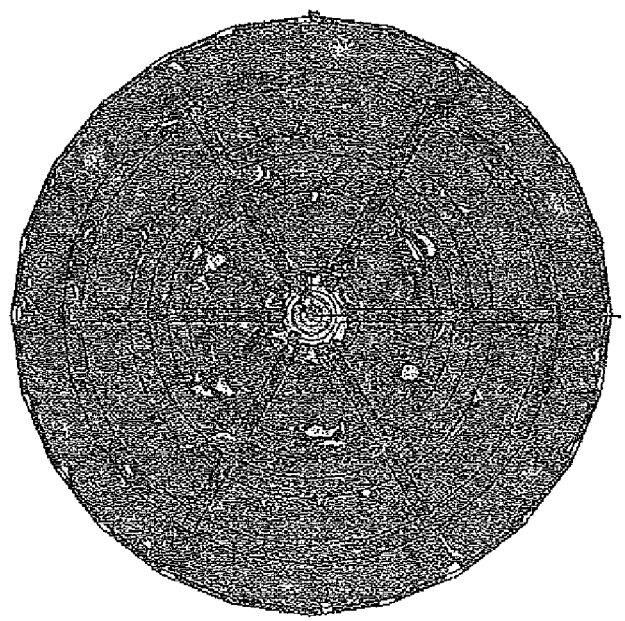
FIG. 11B shows simulation results of electric field distribution according to the ceiling plate of an embodiment of the present invention.

Next, the electric field distribution, which is obtained through simulation carried out using the ceiling plate 56, is described. FIGS. 11A and 11B show the results of the simulation, in which a darker portion indicates higher plasma density. FIG. 11A shows the result of the simulation when only the circular protruding portion 62 is provided, without the microwave propagation control protruding portions 60. FIG. 11B shows the result of the simulation when both the microwave propagation control protruding portions 60 and the circular protruding portion 62 are provided. The microwave frequency is 2.45 GHz, the inside pressure of the process chamber 34 (FIG. 2) is 20 mTorr (2.7 Pa), and the plasma gas is Ar. Regarding the thickness of the ceiling plate 56, H1 is 25 mm, H2 is 17 mm, and H3 is 25 mm.

As shown in FIG. 11A, when only the circular protruding portion 62 is provided in the ceiling plate 56, the plasma spreads two-dimensionally throughout the whole area, which means a superior uniformity of the plasma density is realized. However, a difference is still observed between the high density portion and the low density portion, and there is room for improvement in the uniformity.

On the other hand, when the microwave propagation control protruding portions 60 are provided in addition to the circular protruding portion 62 in the ceiling plate 56, the difference of the plasma densities is reduced especially in the circumferential direction, which confirms significant improvement in the in-plane plasma density.

Figure 12:
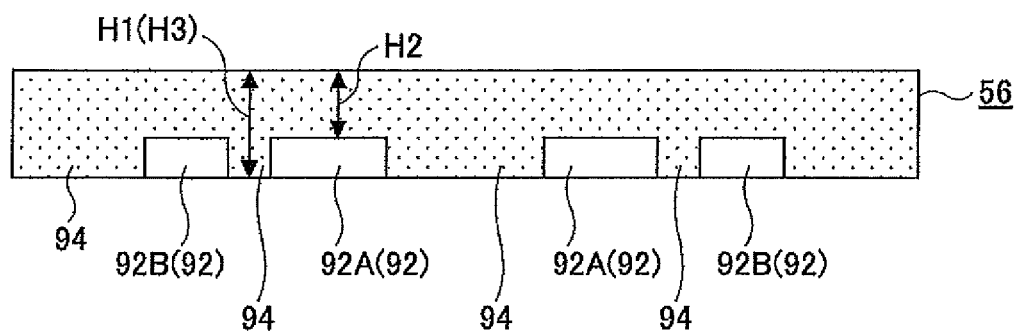
FIG. 12 is a cross-sectional view of a ceiling plate according to another embodiment of the present invention.
Figure 13:
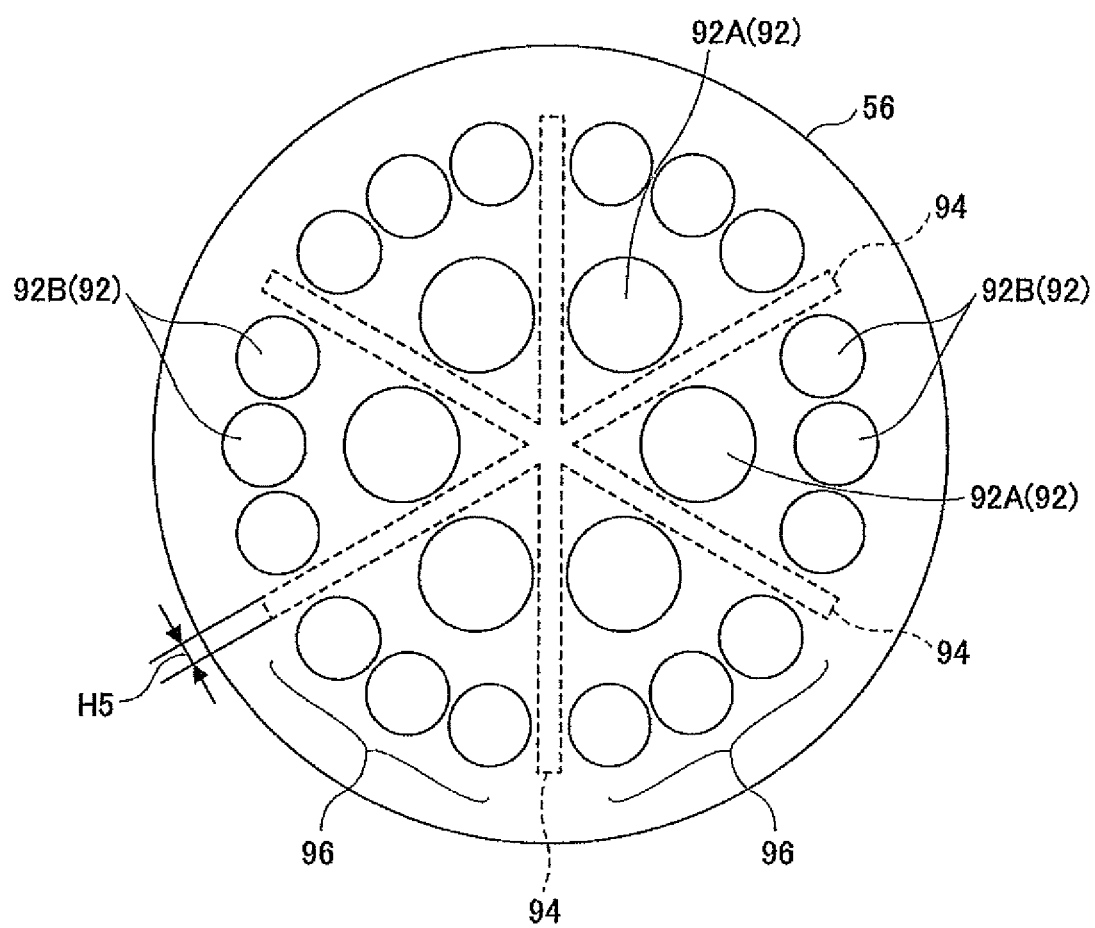
FIG. 13 is a plan view of the ceiling plate of FIG. 12.

While the circular (or ring-shaped) protruding portion 62 and the radial microwave propagation control protruding portions 60 are formed in the ceiling plate 56 in this embodiment, a microwave propagation control concave portion may be formed in the ceiling plate 56 instead of the portions 60, 62 in other embodiments as shown in FIGS. 12 and 13. FIG. 12 is a cross-sectional view of the ceiling plate according to another embodiment, and FIG. 13 is a plan view of the ceiling plate.

As shown, plural of the microwave propagation control concave portions 92 are provided in the lower surface (the surface facing toward the inside of the process chamber 34) of the ceiling plate 56 made of, for example, quartz. The microwave propagation control concave portions 92 each have a circular top-view shape. In addition, the microwave propagation control concave portions 92 include inner microwave propagation control concave portions 92A arranged along one circle, and outer microwave propagation control concave portions 92B arranged along another circle that is concentric to and outside of the one circle. The diameter of the inner microwave propagation control concave portion 92A is larger than the diameter of the outer microwave propagation control concave portion 92B in the illustrated example, but the embodiment is not limited to this. The diameters of the concave portions 92A and 92B may be the same.

The six inner microwave propagation control concave portions 92A are arranged at the same angular intervals along the one circle. In this case, the inner microwave propagation control concave portions 92A are arranged offset from the slots 80 of the planar antenna member 64 (FIGS. 3, 7). In addition, the eighteen outer microwave propagation control concave portions 92B are arranged along the other circle. Moreover, the adjacent three outer microwave propagation control concave portions 92B are close together to form one group 96, and thus there are six groups 96 as a whole in the ceiling plate 56. Every two adjacent groups 96 are apart from each other by a distance of H5.

In the ceiling plate 56 configured in the above manner, convex portions 94 are virtually formed in a place between adjacent the inner microwave propagation control concave portions 92A and a place between adjacent groups 96, the convex portions corresponding to the microwave propagation control protruding portions 60 explained in reference to FIG. 5. Namely, the convex portions 94 can control the microwaves propagating in the circumferential direction of the ceiling plate 56, in the same manner as the microwave propagation control protruding portions 60 (FIG. 5).

In addition, a central part of the ceiling plate 56 virtually corresponds to the circular protruding portion 62A in FIG. 5. Moreover, a ring-shaped portion between the inner microwave propagation control concave portions 92A and the microwave propagation control concave portions 92B located in the middle circumferential portion virtually corresponds to the circular protruding portion 62B in FIG. 5. Furthermore, a ring-shaped portion outside of the outer microwave propagation control concave portions 92B virtually corresponds to the circular protruding portions 62C in FIG. 5. Therefore, the ceiling plate 56 of FIG. 13 can produce the same effect of controlling the microwaves propagating in the radial direction of the ceiling plate 56.

As shown in FIG. 12, the thickness of the places where the inner microwave propagation control concave portions 92A and the outer microwave propagation control concave portions 92B are formed in the ceiling plate 56 is determined to be the same as the thickness H2 shown in FIG. 6, and the thickness of other places, which are virtually considered as the convex portions, is determined to be the same as the thickness H1 or H3 shown in FIG. 6.

Therefore, because the ceiling plate 56 is virtually provided with the microwave propagation control protruding portions 60 and the circular protruding portions 62 (FIG. 5), the ceiling plate 56 in this embodiment can produce the same effect as the previous embodiment. The ceiling plate 56 in this embodiment may be made by forming circular concave portions by, for example, machining a disc-shaped quartz plate, thereby facilitating production of such a ceiling plate compared with the ceiling plate in the previous embodiment.

The microwave propagation control concave portions 92 are arranged along the double rings in this embodiment, but may be arranged along triple rings without being limited to the double rings.

Additionally, while the inner microwave propagation control concave portions 92A, which are positioned in a place with greater microwave intensity, are preferably arranged in a ring shape along the same circle, the outer microwave propagation control concave portions 92B may be arranged at random in this embodiment.

In the preceding embodiments, the thickness (height of microwave propagation cross section) of the ceiling plate 56 is varied by forming the microwave propagation control protruding portions 60 and the circular protruding portion 62, or the microwave propagation control concave portions 92, thereby improving the uniformity of the in-plane plasma density of the microwaves introduced into the process chamber 34 from the planar antenna member 64 through the ceiling plate 56. However, the number of propagation modes of the microwaves propagating in the ceiling plate 56 may be changed by making the ceiling plate 56 with two or more dielectric materials having different dielectric constants. For example, such a ceiling plate 56 may be made by forming a groove (concave portion) having a predetermined top-view shape in a circular plate made of one material having one dielectric constant and embedding the groove (concave portion) within another dielectric material having another dielectric constant. In this case, the top-view shape and depth of the groove (concave portion) and the materials to be used are determined in reference to the above model in order to obtain an appropriate microwave intensity distribution. In addition, the groove (concave portion) may be formed on either the lower surface (facing toward the inside of the process chamber 34) or the upper surface (opposing the lower surface), or both.

Moreover, the microwave propagation control protruding portions 60 and the circular protruding portion 62 (FIGS. 4 and 5) may be formed of different materials from the ceiling plate 56 per se. Furthermore, the microwave propagation control protruding portions 60 may have a different dielectric constant from the circular protruding portion 62. Additionally, the microwave propagation control protruding portions 60, the circular protruding portion 62, and the ceiling plate 56 may have different dielectric constants from one another. With these configurations, while the same effect as shown in FIG. 11B can be obtained, the thicknesses H1 (FIG. 6A) and H3 (FIG. 68) may be reduced compared with where the microwave propagation control protruding portions 60, the circular protruding portion 62, and the ceiling plate 56 are formed of the same material, thereby allowing a greater degree of freedom in designing the plasma process apparatus.

The microwave propagation control protruding portions 60, the circular protruding portion 62, and the ceiling plate 56 may be preferably made of, for example but not limited to, quartz, alumina, aluminum nitride, and silicon nitride.

While the semiconductor wafer is taken as an example as the object to be processed in the above explanation, the present invention may be applied to a glass substrate, a liquid crystal display (LCD) substrate, a ceramic substrate, or the like.

This international patent application is based on Japanese Priority Application No. 2007-221524, filed on Aug. 28, 2007, with the Japanese Patent Office, the entire contents of which are hereby incorporated herein by reference.

The invention claimed is:

1. A ceiling plate that is provided at a ceiling portion of a process chamber that may be evacuated to a vacuum, wherein the ceiling plate allows microwaves emitted from a plurality of slots of a planar antenna member provided along with the ceiling plate to pass through the ceiling plate into the process chamber, the ceiling plate comprising:
   plural concave portions arranged along a circle in a surface of the ceiling plate so as to form plural radially disposed virtual convex portions in a plane between the concave portions, the surface facing toward an inside of the process chamber, wherein the plural concave portions have a circular top view shape,
   wherein a thickness of places where the concave portions are formed in the ceiling plate and another thickness of other places where the concave potions are not formed in the ceiling plate are determined so that the number of propagation modes of microwaves is different in the places where the concave portions are formed from the number of propagation modes in the other places where the concave portions are not formed, and
   wherein a plurality of pairs of the slots are concentrically arranged in the planar antenna member, and the number of the virtual convex portions of the ceiling plate is equal to the number of the pairs of the slots arranged along an inner circle among the plurality of pairs of the slots arranged concentrically.

2. The ceiling plate of claim 1, wherein at least innermost concave portions among the plural concave portions are arranged along one circle with the center thereof at a central part of the ceiling plate.

3. The ceiling plate of claim 1 further comprising:
   plural concave portions provided and arranged along double or more concentric circles at a distance on the respective circles.

4. A plasma process apparatus comprising:
   a process chamber that is open at a ceiling portion and may be evacuated to a vacuum;
   a microwave generation portion that generates microwaves for generating plasma;
      a planar antenna member having plural slots that introduce the microwaves from the microwave generation portion to the process chamber, the planar antenna member being provided at the opening at the ceiling portion; and
      a ceiling plate that allows the microwaves emitted from the planar antenna member to pass through the ceiling plate into the process chamber, the ceiling portion being hermetically provided at the opening at the ceiling portion, wherein plural concave portions arranged along a circle are provided on a surface of the ceiling plate so as to form plural radially disposed virtual convex portions in a place between the concave portions, the surface facing toward the inside of the process chamber, wherein the plural concave portions have a circular top view shape,
   wherein a thickness of places where the concave portions are formed in the ceiling plate and another thickness of other places where the concave portions are not formed in the ceiling plate are determined so that the number of propagation modes of microwaves is different in the places where the concave portions are formed from the number of propagation modes in the other places where the concave portions are not formed, and
   wherein a plurality of pairs of the slots are concentrically arranged in the planar antenna member, and the number of the virtual convex portions of the ceiling plate is equal to the number of the pair of the slots arranged along an inner circle among the plurality of pairs of slots arranged concentrically.

5. The plasma process apparatus of claim 4, wherein at least innermost concave portions among the plural concave portions are arranged along one circle with the center thereof at a central part of the ceiling plate.

6. The plasma process apparatus of claim 5, wherein innermost concave portions are formed corresponding to positions offset from the slots of the planar antenna member.

* * * * *